(12) United States Patent
Takakura et al.

(10) Patent No.: US 12,382,578 B2
(45) Date of Patent: Aug. 5, 2025

(54) METHOD FOR MANUFACTURING WIRING CIRCUIT BOARD

(71) Applicant: NITTO DENKO CORPORATION, Osaka (JP)

(72) Inventors: Hayato Takakura, Osaka (JP); Naoki Shibata, Osaka (JP); Yasunari Oyabu, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 157 days.

(21) Appl. No.: 17/768,758

(22) PCT Filed: Sep. 15, 2020

(86) PCT No.: PCT/JP2020/034940
§ 371 (c)(1),
(2) Date: Apr. 13, 2022

(87) PCT Pub. No.: WO2021/075195
PCT Pub. Date: Apr. 22, 2021

(65) Prior Publication Data
US 2024/0114615 A1    Apr. 4, 2024

(30) Foreign Application Priority Data
Oct. 16, 2019  (JP) ................................ 2019-189408

(51) Int. Cl.
*H05K 1/02*    (2006.01)
*H05K 1/05*    (2006.01)
(Continued)

(52) U.S. Cl.
CPC ............ *H05K 1/0269* (2013.01); *H05K 1/05* (2013.01); *H05K 1/09* (2013.01); *H05K 3/16* (2013.01);
(Continued)

(58) Field of Classification Search
CPC ... G01N 2021/8438; G01N 2021/8918; G01N 21/8422; H05K 1/0269; H05K 1/05; H05K 1/056; H05K 1/09; H05K 2201/0108
See application file for complete search history.

(56) References Cited

U.S. PATENT DOCUMENTS

| | | |
|---|---|---|
| 5,310,966 A | 5/1994 | Iida et al. |
| 2005/0260391 A1 | 11/2005 | Nakamura et al. |

(Continued)

FOREIGN PATENT DOCUMENTS

| | | |
|---|---|---|
| CN | 105979695 A | 9/2016 |
| JP | 5-226833 A | 9/1993 |

(Continued)

OTHER PUBLICATIONS

International Preliminary Report on Patentability issued by WIPO on Apr. 19, 2022, in connection with International Patent Application No. PCT/JP2020/034940.

(Continued)

*Primary Examiner* — Minh N Trinh
(74) *Attorney, Agent, or Firm* — Edwards Neils LLC; Jean C. Edwards, Esq.

(57) ABSTRACT

A method for manufacturing a wiring circuit board includes steps: 1) preparing a metal supporting layer, a different-reflectance layer, an insulating base layer, and a wiring layer sequentially toward one side in a thickness direction, and 2) irradiating the circuit board with reflected light including light containing one wavelength in light between wavelengths 650 nm and 950 nm from one side in the thickness direction of the circuit board to inspect the wiring layer based on the reflected light at the circuit board. In 2), the outer shape of the wiring layer is inspected based on the contrast between first reflected light at one surface in the thickness direction of the wiring layer and second reflected (Continued)

light at one surface in the thickness direction of the different-reflectance layer. The difference between a reflectance R1 of the wiring layer and a reflectance R2 of the different-reflectance layer is 40% or more.

6 Claims, 2 Drawing Sheets

(51) Int. Cl.
  *H05K 1/09* (2006.01)
  *H05K 3/16* (2006.01)
(52) U.S. Cl.
  CPC ............ *H05K 2201/2054* (2013.01); *H05K 2203/163* (2013.01)

(56) References Cited

U.S. PATENT DOCUMENTS

| | | | |
|---|---|---|---|
| 2007/0108631 A1 | 5/2007 | Nakamura et al. | |
| 2010/0208250 A1 | 8/2010 | Ihara et al. | |
| 2010/0263206 A1 | 10/2010 | Toyoda et al. | |
| 2012/0055697 A1 | 3/2012 | Okamoto | |
| 2016/0266050 A1 | 9/2016 | Toyoda | |
| 2017/0345767 A1 | 11/2017 | Watanabe | |
| 2024/0114615 A1* | 4/2024 | Takakura | G01N 21/8422 |

FOREIGN PATENT DOCUMENTS

| | | |
|---|---|---|
| JP | H07-336024 A | 12/1995 |
| JP | 2005-333028 A | 12/2005 |
| JP | 2006-112845 A | 4/2006 |
| JP | 2007-134658 A | 5/2007 |
| JP | 2010-190671 A | 9/2010 |
| JP | 2010-251513 A | 11/2010 |
| JP | 2011-018947 A | 1/2011 |
| JP | 2011-169822 A | 9/2011 |
| JP | 2012-059756 A | 3/2012 |
| JP | 2019-031739 A | 2/2019 |
| TW | 201633873 A | 9/2016 |
| WO | 2016/088522 A1 | 6/2016 |

OTHER PUBLICATIONS

International Search Report issued in PCT/JP2020/034940 on Dec. 1, 2020.
Written Opinion issued in PCT/JP2020/034940 on Dec. 1, 2020.
Notification of Reasons for Refusal issued in Japanese Patent Application No. 2019-189408 on Oct. 26, 2021.
Notification of Reasons for Refusal issued in Japanese Patent Application No. 2019-189408 on Dec. 14, 2021.
Decision of Refusal issued in Japanese Patent Application No. 2019-189408 on Jan. 25, 2022.
Reconsideration Report by Examiner before Appeal issued by the Japanese Patent Office on Jul. 26, 2022, in connection with Japanese Patent Application No. 2019-189408.
Office Action, issued by the Taiwanese Intellectual Property Office on Jun. 25, 2024, in connection with Taiwanese Patent Application No. 109133094.
Office Action, issued by the State Intellectual Property Office of China on May 1, 2025, in connection with Chinese Patent Application No. 202080072580.9.
Office Action, issued by the Korean Intellectual Property Office on Apr. 22, 2025, in connection with Korean Patent Application No. 10-2022-7011698.

* cited by examiner

METHOD FOR MANUFACTURING WIRING CIRCUIT BOARD

CROSS-REFERENCE TO RELATED APPLICATIONS

The present application is a 35 U.S.C. 371 National Stage Entry of: PCT/JP2020/034940, filed on Sep. 15, 2020, which claims priority from Japanese Patent Application No. 2019-189408, filed on Oct. 16, 2019, the contents of all of which are herein incorporated by reference in their entirety.

TECHNICAL FIELD

The present invention relates to a method for manufacturing a wiring circuit board.

BACKGROUND ART

There are conventional methods for inspecting the quality of a conductor pattern by using the reflected light of light irradiating a circuit-formed suspension substrate, which includes a metal supporting layer made of a stainless steel, an insulating base layer, and the conductor pattern made of copper at one side in a thickness direction, from the one side in the thickness direction (for example, see Patent document 1 below).

In Patent document 1, the difference between the reflectance of the copper with respect to light with a wavelength of 650 nm and the reflectance of the stainless steel with respect to light with a wavelength of 650 nm is approximately 33%. Accordingly, the outer shape of the conductor pattern is recognized by the contrast based on the difference.

CITATION LIST

Patent Document

Patent Document 1: Japanese Unexamined Patent Publication No. 2012-059756

SUMMARY OF THE INVENTION

Problem to be Solved by the Invention

As fine-pitch wiring layers have become common in these years, much greater accuracy is required for the inspection. For the precise inspection, a much stronger contrast is required.

However, there is a limitation on increasing the contrast between the above-described metal supporting layer and conductor pattern.

The present invention provides a method for manufacturing a wiring circuit board where the contrast between the first reflected light at the wiring layer and the second reflected light at the different-reflectance layer is strengthened and thus the wiring layer can be inspected with high accuracy.

Means for Solving the Problem

The present invention [1] includes a method for manufacturing a wiring circuit board, the method including: a first step of preparing a wiring circuit board including a metal supporting layer, a different-reflectance layer, an insulating layer, and a wiring layer sequentially toward one side in a thickness direction, and a second step of irradiating the wiring circuit board with inspection light containing one wavelength in light between wavelengths of 650 nm or more and 950 nm or less from one side in the thickness direction of the wiring circuit board to inspect an outer shape of the wiring layer based on reflected light reflected at the wiring circuit board, wherein in the second step, the wiring layer is inspected based on a contrast between first reflected light reflected at one surface in the thickness direction of the wiring layer and second reflected light reflected at one surface in the thickness direction of the different-reflectance layer, and a difference between a reflectance R1 of the wiring layer with respect to the light with the one wavelength and a reflectance R2 of the different-reflectance layer with respect to the light with the one wavelength is 40% or more.

The present invention [2] includes the method described in [1] above, wherein the reflectance R1 of the wiring layer is higher than the reflectance R2 of the different-reflectance layer.

The present invention [3] includes the method described in [1] or [2] above, wherein a material of the wiring layer is copper and/or gold, and a material of the different-reflectance layer is at least one metal selected from the group consisting of chromium, nickel, titanium, tungsten, zinc, and iron.

The present invention [4] includes the method described in any one of [1] to [3] above, wherein a difference between the reflectance R1 of the wiring layer and a reflectance R3 of the metal supporting layer with respect to the light with the one wavelength is 20% or less.

The present invention [5] includes the method described in any one of [1] to [4] above, wherein the different-reflectance layer has a thickness of 0.1 μm or less.

The present invention [6] includes the method described in any one of [1] to [5] above, wherein the different-reflectance layer is formed by sputtering in the first step.

Effects of the Invention

In the manufacturing method of the present invention, the difference between the reflectance R1 of the wiring layer and the reflectance R2 of the different-reflectance layer is 40% or more, i.e., large. This large difference can increase the contrast between the first reflected light at the wiring layer and the second reflected light at the different-reflectance layer. Thus, the outer shape of the wiring layer can be inspected with high accuracy.

DESCRIPTION OF THE EMBODIMENTS

One embodiment of the method for manufacturing a wiring circuit board of the present invention is described.

Figure 1:
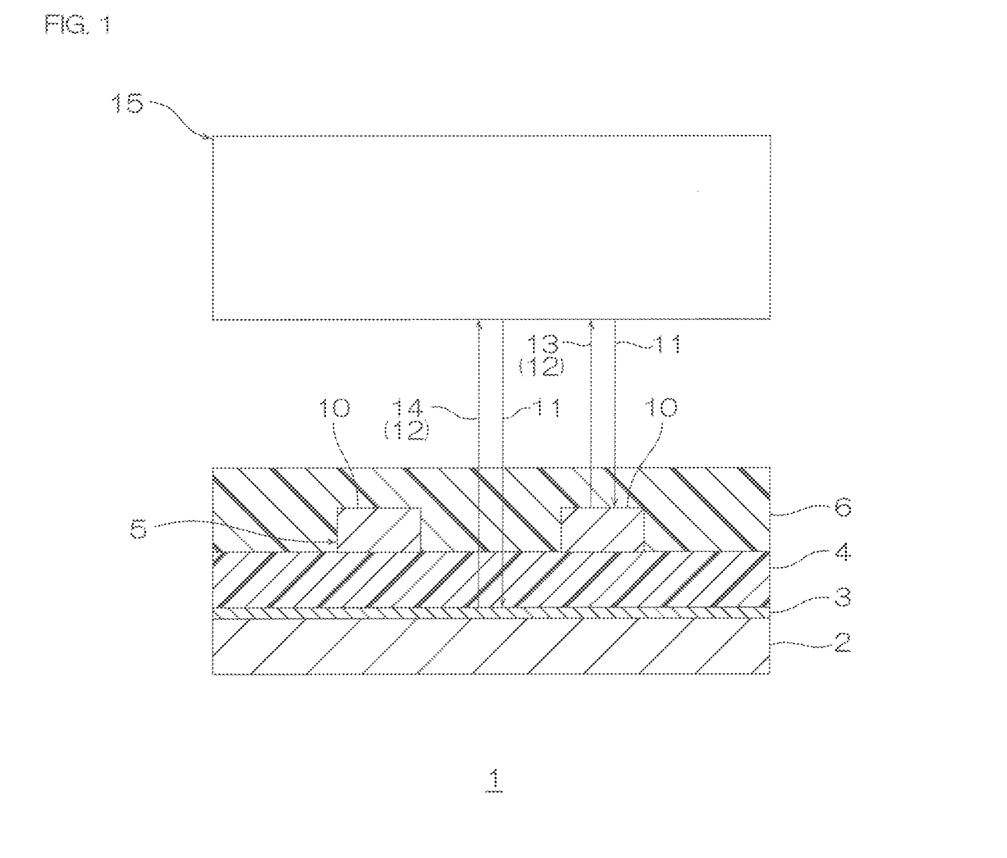
FIG. 1 is a cross-sectional view of a wiring circuit board manufactured by one embodiment of the manufacturing method of the present invention.

The method for manufacturing a wiring circuit board 1 includes a first step of preparing the wiring circuit board 1 shown in FIG. 1, and a second step of inspecting a wiring layer 5 (described below).

<First Step>

The wiring circuit board 1 has one surface and the other surface facing each other in a thickness direction. The wiring circuit board 1 has an approximately flat board shape extending in a surface direction orthogonal to the thickness direction.

The wiring circuit board 1 includes a metal supporting layer 2, a different-reflectance layer 3, an insulating base layer 4 as an exemplary insulating layer, the wiring layer 5, and an insulating cover layer 6 sequentially toward one side in the thickness direction. The wiring circuit board 1 includes the metal supporting layer 2, the different-reflectance layer 3 disposed on one surface in the thickness direction of the metal supporting layer 2, the insulating base layer 4 disposed on one surface in the thickness direction of the different-reflectance layer 3, the wiring layer 5 disposed on one surface in the thickness direction of the insulating base layer 4, and the insulating cover layer 6 disposed on one surface and side surfaces in the thickness direction of the wiring layer 5. The wiring circuit board 1 preferably includes only the metal supporting layer 2, the different-reflectance layer 3, the insulating base layer 4, the wiring layer 5, and the insulating cover layer 6.

The metal supporting layer 2 has an approximately flat board shape. A material of the metal supporting layer 2 is described below. The size of the metal supporting layer 2 is not limited. The lower limit of the thickness of the metal supporting layer 2 is, for example, 30 μm, preferably 50 μm, more preferably 100 μm. The upper limit of the thickness of the metal supporting layer 2 is, for example, 10 mm, preferably 1 mm.

The different-reflectance layer 3 has a reflectance R2 different from a reflectance R1 of the wiring layer 5 as described below. The different-reflectance layer 3 is in contact with the one surface in the thickness direction of the metal supporting layer 2. Further, the different-reflectance layer 3 is disposed on the whole of the one surface in the thickness direction of the metal supporting layer 2. The different-reflectance layer 3 has a thin layer shape extending in the surface direction. Furthermore, the one surface in the thickness direction of the different-reflectance layer 3 is flat and parallel to the one surface in the thickness direction of the metal supporting layer 2.

The material, surface roughness, and reflectance R2 of the different-reflectance layer 3 are described below.

The lower limit of the thickness of the different-reflectance layer 3 is, for example, 1 nm. The upper limit of the thickness of the different-reflectance layer 3 is, for example, 1 μm, preferably 0.5 μm, more preferably 0.1 μm.

When the thickness of the different-reflectance layer 3 is the above-described lower limit or more, a predetermined reflectance R2 can surely be obtained. When the thickness of the different-reflectance layer 3 is the above-described upper limit or less, the wiring circuit board 1 is thinned.

The insulating base layer 4 is in contact with the one surface in the thickness direction of the different-reflectance layer 3. The insulating base layer 4 has a thin layer shape extending in the surface direction. Examples of the material of the insulating base layer 4 include insulating resins such as polyimide.

The insulating base layer 4 has properties for detecting reflected light 12 (second reflected light 14) (described below) by transmitting inspection light 11 described below. Specifically, the upper limit of the thickness of the insulating base layer 4 is, for example, 100 μm, preferably 50 μm, and the lower limit of the thickness of the insulating base layer 4 is, for example, 1 μm, preferably 5 μm. With respect to light with a wavelength of 650 nm or more and 950 nm or less (specifically, light having one wavelength selected from the wavelength range of 650 nm or more and 950 nm or less, and used in the second step), the lower limit of the light transmittance of the insulating base layer 4 is, for example, 70%, preferably 80%, more preferably 90%. The upper limit of the light transmittance of the insulating base layer 4 is, for example, 100%. The method for measuring the light transmittance is obtained in conformity with JIS K 7375 (2008).

The wiring layer 5 is in contact with the one surface in the thickness direction of the insulating base layer 4. The wiring layer 5 integrally has a plurality of wires 10 and terminals (not illustrated) disposed on edges of the wires 10. The wires 10 are separated from each other by an interval therebetween. Each of the wires 10 extends in an orthogonal direction to an adjacent direction in which the wires 10 are adjacent to each other. Each of the wires 10 has, for example, an approximately rectangular shape in the cross-sectional view. Each of the wires 10 has one surface and the other surface facing each other in the thickness direction, one side surface connecting one edge of the one surface and one edge of the other surface, and the other side surface connecting the other edge of the one surface and the other edge of the other surface.

The material, surface roughness, and refractive index R1 of the wiring layer 5 are described below.

The lower limit of the thickness of the wiring layer 5 is, for example, 1 μm, preferably 5 μm. The upper limit of the thickness of the wiring layer 5 is, for example, 50 μm, preferably 30 μm.

The upper limit of the width of each of the wires 10 (length in a direction orthogonal to a direction in which the wires 10 extend and the thickness direction) is, for example, 100 μm, preferably 30 μm, more preferably 20 μm. The lower limit of the width of each of the wires 10 is, for example, 1 μm, preferably 3 μm.

The upper limit of the interval between the adjacent wires 10 is, for example, 100 μm, preferably 30 μm, more preferably 20 μm. The lower limit of the width of each of the wires 10 is, for example, 1 μm, preferably 3 μm.

When the width of each wire 10 and interval of the wires 10 are the above-described upper limits or less, the wires 10 can be fine pitch.

The insulating cover layer 6 is disposed on the one surface in the thickness direction of the insulating base layer 4 to cover the wires 10 and expose the terminals not illustrated. Specifically, the insulating cover layer 6 covers one surfaces and side surfaces in thickness direction of the wires 10. The insulating cover layer 6 has a layer shape extending in the surface direction. The thickness, material, and light transmittance of the insulating cover layer 6 are the same as those of the insulating base layer 4.

<Material, Surface Roughness, and Reflectance of Each of Different-Reflectance Layer and Wiring Layer>

(Difference in Reflectance)

The difference (|R1−R2|) between the reflectance R1 of the wiring layer 5 with respect to light containing one wavelength in the light between wavelengths of 650 nm or more and 950 nm or less and the reflectance R2 of the different-reflectance layer 3 with respect to the light with the above-described one wavelength is 40% or more.

The reflectance R1 of the wiring layer 5 is in conformity with JIS R 3106 (2019) and obtained by detecting the reflected light of the irradiation of the wiring layer 5 of the wiring circuit board 1 with inspection light at an incidence angle of 5 degrees. The reflectance R2 of the different-reflectance layer 3 is obtained by the same method as described above.

The light used in the measurement of the reflectance R1 of the wiring layer 5 has the same wavelength as that of the light used in the measurement of the reflectance R2 of the different-reflectance layer 3.

The incidence angle is formed by an irradiation direction in which the inspection light irradiates and a normal direction in which the normal to the one surface in the thickness direction of the wiring layer 5 extends.

When the difference (|R1−R2|) is less than 40% (0% or more and less than 40%), the contrast between the first reflected light 13 and the second reflected light 14 (described below) cannot sufficiently be increased in the second step described below. Thus, when the wires 10 are fine pitch, the wires 10 cannot be inspected with high accuracy.

The lower limit of the difference (|R1−R2|) is preferably 45%, more preferably 50%.

On the other hand, the upper limit of the difference (|R1−R2|) is not especially limited.

Preferably, the reflectance R1 of the wiring layer 5 with respect to light containing one wavelength in the light between wavelengths of 650 nm or more and 950 nm or less is higher than the reflectance R2 of the different-reflectance layer 3 with respect to the light with the above-described one wavelength. In other words, the value (R1−R2) of the reflectance R2 of the different-reflectance layer 3 subtracted from the reflectance R1 of the wiring layer 5 is a positive number. In this manner, the different-reflectance layer 3 is a low-reflectance layer having a reflectance R2 lower than the reflectance R1 of the wiring layer 5. When the reflectance R1 of the wiring layer 5 is higher than the reflectance R2 of the different-reflectance layer 3, it makes it easy to select the materials of the wiring layer 5 and different-reflectance layer 3.

The reflectance R1 and material of the wiring layer 5 and the reflectance R2 and material of the different-reflectance layer 3 are appropriately selected so that the above-described difference (|R1−R2|) becomes 40% or more.

The upper limit of a ratio (R2/R1) of the reflectance R2 of the different-reflectance layer 3 to the reflectance R1 of the wiring layer 5 is, for example, 0.5, and the lower limit thereof is 0.1.

Specifically, examples of the material of the wiring layer 5 include metals (conductors) such as copper, silver, gold, iron, and aluminum. These can be used singly or in combination of two or more. As the material of the wiring layer 5, preferably, copper, a copper alloy, and gold are used to obtain high electrical conductivity. More preferably, copper and gold are used.

Examples of the material of the different-reflectance layer 3 include metals and resins. Preferably, a metal is used. More preferably, chromium, nickel, titanium, tungsten, zinc, and iron are used. These can be used singly or in combination of two or more.

Instead of or together with the selection of the material, an arithmetic surface roughness Ra of each of the different-reflectance layer 3 and the wiring layer 5 can be adjusted. Specifically, the upper limit of the arithmetic surface roughness Ra of the wiring layer 5 is set to, for example, 70 nm, preferably 60 nm. Meanwhile, the lower limit of the arithmetic surface roughness Ra of the different-reflectance layer 3 is set to, for example, 75 nm, preferably 90 nm. This makes the difference (|R1−R2|) in reflectance 40%, and makes the reflectance R1 of the wiring layer 5 higher than the reflectance R2 of the different-reflectance layer 3. The arithmetic surface roughness Ra of each of the different-reflectance layer 3 and the wiring layer 5 is obtained in conformity with JIS B 0601 (2013).

<Material and Reflectance of Metal Supporting Layer>

A material of the metal supporting layer 2 is not especially limited. The material of the metal supporting layer 2 can appropriately be selected, for example, from known or common metallic materials (specifically, metal materials). Specific examples of the metallic materials include the metal elements classified as the 1st to 16th groups and alloys containing two or more of the metal elements. The metallic materials may be either of transition metals or basic metals. More specific examples of the metallic materials include the Group 2 metal elements such as calcium, the Group 4 metal elements such as titanium and zirconium, the Group 5 metal elements such as vanadium, the Group 6 metal elements such as chromium, molybdenum, and tungsten, the Group 7 metal elements such as manganese, the Group 8 metal elements such as iron, the Group 9 metal elements such as cobalt, the Group 10 metal elements such as nickel, and platinum, the Group 11 metal elements such as copper, silver, and gold, the Group 12 metal elements such as zinc, the Group 13 metal elements such as aluminum and gallium, and the Group 14 metal elements such as germanium and tin. These can be used singly or in combination of two or more.

As the metallic material, a material that makes the difference (|R1−R2|) between the reflectance R1 of the wiring layer 5 and the reflectance R3 of the metal supporting layer with respect to light with the above-described wavelength, for example, 35% or less, preferably 20% or less, more preferably 15% or less is selected.

The reflectance R3 of the metal supporting layer 2 is obtained by the same method as that of measuring the reflectance R1 of the wiring layer 5. The light used in the measurement of the reflectance R3 of the metal supporting layer 2 has the same wavelength as that of the light used in the measurement of the reflectance R1 of the wiring layer 5.

As the metallic material, preferably, the same material as that of the wiring layer 5 is used. When the materials of the wiring layer 5 and the metal supporting layer 2 are the same, it simplifies the manufacturing process.

When the materials of the wiring layer 5 and the metal supporting layer 2 are the same, on the other hand, it eliminates the contrast between the reflected light at the wiring layer 5 and the reflected light at the metal supporting layer 2. However, the wiring circuit board 1 includes the different-reflectance layer 3 between the metal supporting layer 2 and the wiring layer 5, and the difference between the reflectance of the metal supporting layer 2 and the reflectance of the different-reflectance layer 3 is 40% or more, namely, large. The large difference can sufficiently increase the contrast between the first reflected light 13 and the second reflected light 14 (described below) in the second step.

To prepare the wiring circuit board 1 in the first step, for example, the different-reflectance layer 3, the insulating base layer 4, the wiring layer 5, and the insulating cover layer 6 are sequentially laminated on the metal supporting layer 2.

For example, the metal supporting layer 2 is prepared first.

Next, the different-reflectance layer 3 is disposed on the one surface in the thickness direction of the metal supporting layer 2. When the material of the different-reflectance layer 3 is a metal, for example, sputtering or plating is used to dispose the different-reflectance layer 3 on the one surface in the thickness direction of the metal supporting layer 2. When the material of the different-reflectance layer 3 is a resin, for example, coating is used to dispose the different-reflectance layer 3 on the one surface in the thickness direction of the metal supporting layer 2.

To form a uniform layer, preferably, the different-reflectance layer 3 is formed by sputtering.

Subsequently, by applying the material of the insulating base layer 4, the insulating base layer 4 is disposed on the one surface in the thickness direction of the different-reflectance layer 3.

Subsequently, by using an additive technique or a subtractive technique, the wiring layer 5 is disposed on the one surface in the thickness direction of the insulating base layer 4.

Thereafter, by applying the material of the insulating cover layer 6, the insulating cover layer 6 is disposed on the one surface in the thickness direction of the insulating base layer 4 so as to cover the wiring layer 5.

<Second Step>

In the second step, an outer shape of the wiring layer 5 is inspected.

For example, in the second step, an inspection device 15 is used. The inspection device 15 is disposed on one side in the thickness direction of the wiring circuit board 1. The inspection device 15 includes a light-emitting member and a light-receiving member (neither illustrated).

The light-emitting member allows the inspection light 11 to be incident on the wiring circuit board 1. The light-emitting member includes, for example, an LED (light emitting diode).

The inspection light 11 is required only to include light with wavelengths of 650 nm or more and 950 nm or less. For the inspection light 11, one wavelength (for example, 650 nm, 850 nm, or 950 nm) is selected from the above-described wavelength range.

The light-receiving member can receive the reflected light 12 (the first reflected light 13 and second reflected light 14 described below). The light-receiving member includes a camera such as a CCD camera.

To carry out the second step, one surface in the thickness direction of the wiring circuit board 1 is irradiated with the inspection light 11 from the light-emitting member of the inspection device 15.

A part of the inspection light 11 is transmitted through the insulating cover layer 6 located on one side in the thickness direction of the wiring layer 5, reaches the one surface in the thickness direction of the wiring layer 5, and generates the first reflected light 13 there.

The upper limit of the incidence angle of the inspection light 11 on the wiring layer 5 is, for example, 30 degrees, preferably 15 degrees, and the lower limit thereof is 0 degree. The incidence angle is formed by a direction in which the inspection light 11 travels and a normal direction in which the normal to the one surface in the thickness direction of the wiring layer 5 extends.

The remaining part of the inspection light 11 is sequentially transmitted through the insulating cover layer 6 around the wiring layer 5 and the insulating base layer 4, reaches the one surface in the thickness direction of the different-reflectance layer 3, and generates the second reflected light 14 there.

The upper limit of the incidence angle of the inspection light 11 on the different-reflectance layer 3 is, for example, 30 degrees, preferably 15 degrees, and the lower limit thereof is 0 degree. The incidence angle is formed by a direction in which the inspection light 11 travels and a normal direction in which the normal to the one surface in the thickness direction of the different-reflectance layer 3 extends.

The first reflected light 13 and the second reflected light 14 form the reflected light 12 reflected on the wiring circuit board 1. The reflected light 12 includes the first reflected light 13 and the second reflected light 14.

Preferably, the reflected light 12 includes only the first reflected light 13 and the second reflected light 14. In other words, because the insulating cover layer 6 and the insulating base layer 4 are transparent, the reflected light 12 is not substantially generated at the one surface in the thickness direction of the insulating cover layer 6 and at the one surface in the thickness direction of the insulating base layer 4.

Meanwhile, the different-reflectance layer 3 having the above-described reflectance R2 is disposed on the whole of the one surface in the thickness direction of the metal supporting layer 2. Thus, the inspection light 11 is reflected at the one surface in the thickness direction of the different-reflectance layer 3 before reaching the one surface in the thickness direction of the metal supporting layer 2. As a result, the reflected light 12 (the third reflected light as demonstrated by Comparative Examples 2 and 4) is not substantially generated at the one surface in the thickness direction of the metal supporting layer 2.

The reflected light 12 is received by the light-receiving member. The first reflected light 13 is transmitted through the insulating cover layer 6 and reaches the light-receiving member. The second reflected light 14 is sequentially transmitted through the insulating base layer 4 and the insulating cover layer 6, and reaches the light-receiving member.

The first reflected light 13 and second reflected light 14 received by the light-receiving member have a contrast based on the difference in intensity between the lights. Specifically, the first reflected light 13 generated at the one surface in the thickness direction of the wiring layer 5 and the second reflected light 14 generated at the one surface in the thickness direction of the different-reflectance layer 3 have a strong contrast because the difference (|R1−R2|) in the reflectance is 40% or more, namely, large.

Based on the contrast, the outer shape of the wiring layer 5 is inspected.

For example, by detecting the outer shape of the wiring layer 5, the quality of the wiring layer 5 is determined.

In the above-described method for manufacturing the wiring circuit board 1, the difference between the reflectance R1 of the wiring layer 5 and the reflectance R2 of the different-reflectance layer 3 is 40% or more, i.e., large. Thus, the contrast between the first reflected light 13 at the wiring layer 5 and the second reflected light 14 at the different-reflectance layer 3 can be increased.

Thus, even when the wiring layer 5 is fine pitch, the outer shape of the wiring layer 5 can be inspected with high accuracy.

When the reflectance R1 of the wiring layer 5 is higher than the reflectance R2 of the different-reflectance layer 3, it makes it easy to select the materials of the wiring layer 5 and the different-reflectance layer 3.

Specifically, copper and/or gold with high electrical conductivity and a high reflectance R1 can be selected as the material of the wiring layer 5. After the selection, at least one metal can be selected from the group consisting of chromium, nickel, titanium, tungsten, zinc, and iron as the material of the different-reflectance layer 3, i.e., as the material having a reflectance lower than the reflectance R1 of the wiring layer 5.

When the difference between the reflectance R1 of the wiring layer 5 and the reflectance R3 of the metal supporting layer 2 is 20% or less, i.e., small in a conventional method for manufacturing a wiring circuit board 1 without a different-reflectance layer 3, the contrast based on the difference is weak. Thus, the outer shape of the wiring layer 5 cannot be inspected with high accuracy.

However, as the embodiment demonstrates, the method for manufacturing the wiring circuit board 1 including the different-reflectance layer 3 can strengthen the contrast between the first reflected light 13 at the wiring layer 5 and the second reflected light 14 at the different-reflectance layer 3 as described above. Thus, even though the difference between the reflectance R1 of the wiring layer 5 and the reflectance R3 of the metal supporting layer 2 is 20% or less, i.e., small, the outer shape of the wiring layer 5 can be inspected with high accuracy.

Further, the different-reflectance layer 3 has a thickness of 0.1 μm or less, and thus the wiring circuit board 1 can be thinned.

Furthermore, when the different-reflectance layer 3 is formed by sputtering in the first step, the different-reflectance layer 3 is uniformly formed. Thus, the contrast is stabilized during the inspection in the second step.

EXAMPLE

The present invention is described in more detail below with reference to Examples and Comparative Examples. The present invention is not limited to Examples and Comparative Examples in any way. The specific numeral values used in the description below, such as mixing ratios (contents), physical property values, and parameters can be replaced with the corresponding mixing ratios (contents), physical property values, and parameters in the above-described "DESCRIPTION OF THE EMBODIMENTS", including the upper limit values (numeral values defined with "or less", and "less than") or the lower limit values (numeral values defined with "or more", and "more than").

Example 1

A metal supporting layer 2 having a thickness of 100 μm and made of a copper alloy (copper-titanium alloy) was prepared. The reflectance R3 of the metal supporting layer 2 with respect to light with a wavelength of 650 nm was 81.1%.

Subsequently, a different-reflectance layer 3 having a thickness of 0.05 μm and made of chromium was formed on one surface in the thickness direction of the metal supporting layer 2 by sputtering. The reflectance R2 of the different-reflectance layer 3 with respect to light with a wavelength of 650 nm was 42.0% The different-reflectance layer 3 had an arithmetic surface roughness Ra of 100 nm.

Subsequently, an insulating base layer 4 having a thickness of 15 μm and made of polyimide was formed on one surface in the thickness direction of the different-reflectance layer 3 by the application, exposure, and development of the material. The light transmittance of the insulating base layer 4 with respect to light with a wavelength of 650 nm was 90%.

Subsequently, a wiring layer 5 having a thickness of 10 μm and made of copper was formed on one surface in the thickness direction of the insulating base layer 4 by an additive technique. Each wire 10 had a width of 10 μm. The interval between the adjacent wires 10 was 10 μm.

The reflectance R1 of the wiring layer 5 with respect to light with a wavelength of 650 nm was 94.6%. In other words, the difference between the reflectance R1 of the wiring layer 5 and the reflectance R2 of the different-reflectance layer 3 was 52.6%.

The wiring layer 5 had an arithmetic surface roughness Ra of 50 nm.

Thereafter, an insulating cover layer 6 having a thickness of 15 μm and made of polyimide was formed so as to cover the wires 10 and expose the terminals (not illustrated). The light transmittance of the insulating cover layer 6 with respect to light with a wavelength of 650 nm was 90%.

In this manner, a wiring circuit board 1 was prepared (the first step).

The above-described inspection device 15 was disposed at one side of the wiring circuit board 1 in the thickness direction. The wiring circuit board 1 was irradiated with the inspection light 11 which was red light including a wavelength of 650 nm from the light-emitting member, thereby recognizing the outer shapes of the wires 10 of the wiring layer 5 based on the reflected light 12 including the first reflected light 13 and the second reflected light 14 and generated at the wiring circuit board 1 (the second step).

Figure 2:
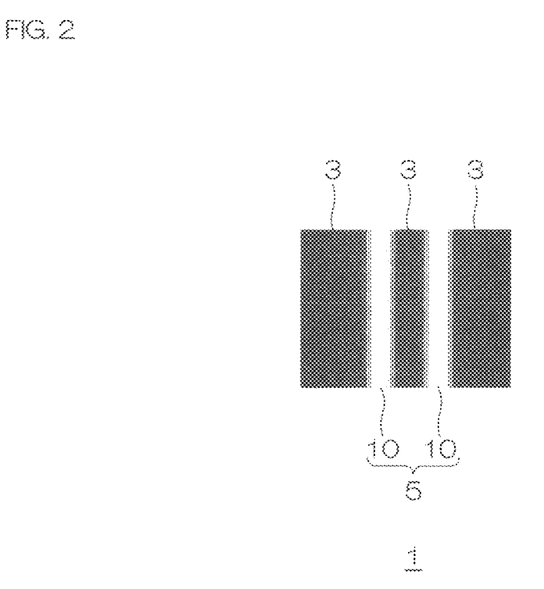
FIG. 2 is a view of a processed image of the wiring layer and different-reflectance layer processed based on the reflected light in the second step of Example 1.

FIG. 2 shows an image of the wiring layer 5 processed based on the detection by the light-receiving member.

Example 2 Through Comparative Example 5

Except that the layer structure, the properties of each layer, and the wavelength used at the second step were changed according to Tables 1 to 3, the first and second steps were carried out in the same manner as Example 1.

For the second step in each of Examples 2 to 12 and Comparative Examples 1 to 4, light with a wavelength of 650 nm was used. For the second step in each of Examples 13 to 15 and Comparative Example 5, light with a wavelength of 850 nm was used.

Evaluation

The inspection of the wires 10 in the second step was evaluated as follows.

In detail, Examples 1 to 15 and Comparative Examples 1 and 3 included the different-reflectance layer 3, and the contrast between the first reflected light 13 at the wiring layer 5 and the second reflected light 14 at the different-reflectance layer 3 was used to evaluate the following.

Comparative Examples 2 and 4 did not include the different-reflectance layer 3, and the contrast between the first reflected light 13 at the wiring layer 5 and the third reflected light at the metal supporting layer 2 was used to evaluate the following.

Good: the reflected light 12 had a strong contrast and the outer shapes of the wires 10 were clearly recognized based on the contrast.

Bad: the reflected light 12 had a weak contrast and thus the outer shapes of the wires 10 were not clearly recognized.

TABLE 1

| Light with wavelength of 650 nm | | Example 1 | Example 2 | Example 3 | Comp. Ex. 1 | Comp. Ex. 2 | Example 4 |
|---|---|---|---|---|---|---|---|
| Wiring layer | Material | Copper | Copper | Copper | Copper | Copper | Copper |
| | Surface roughness Ra (nm) | 50.0 | 50.0 | 50.0 | 50.0 | 50.0 | 50.0 |
| | Reflectance R1 (%) | 94.6 | 94.6 | 94.6 | 94.6 | 94.6 | 94.6 |
| Different-reflectance layer | Material | Chromium | Chromium | Chromium | Copper alloy[*1] | — | Chromium |
| | Surface roughness Ra (nm) | 100.0 | 100.0 | 100.0 | 50.0 | | 100.0 |
| | Reflectance R2 (%) | 42.0 | 42.0 | 42.0 | 81.1 | | 42.0 |
| | Thickness (μm) | 0.05 | 0.05 | 0.5 | 0.05 | 0.05 | 0.05 |
| | Production method | Sputtering | Plating | Sputtering | Sputtering | Sputtering | Sputtering |
| Metal supporting layer | Material | Copper alloy[*1] | Copper alloy[*1] | Copper alloy[*1] | Copper alloy[*1] | Copper alloy[*1] | Stainless steel[*2] |
| | Reflectance R3 (%) | 81.1 | 81.1 | 81.1 | 81.1 | 81.1 | 62.1 |
| Difference between reflectance R1 of wiring layer and reflectance R2 around wiring layer | R1 − R2 (%) | 52.6 | 52.6 | 52.6 | 13.5 | — | 52.6 |
| | R1 − R3 (%) | 13.5 | 13.5 | 13.5 | 13.5 | 13.5 | 32.5 |
| Evaluation | Inspection of wires | Good | Good | Good | Bad | Bad | Good |

| Light with wavelength of 650 nm | | Comp. Ex. 3 | Comp. Ex. 4 | Example 5 | Example 6 | Example 7 |
|---|---|---|---|---|---|---|
| Wiring layer | Material | Copper | Copper | Gold | Copper alloy[*1] | Iron |
| | Surface roughness Ra (nm) | 50.0 | 50.0 | 50.0 | 50.0 | 100.0 |
| | Reflectance R1 (%) | 94.6 | 94.6 | 93.3 | 81.1 | 30.3 |
| Different-reflectance layer | Material | Copper alloy[*1] | — | Chromium | Zinc | Copper alloy[*1] |
| | Surface roughness Ra (nm) | 50.0 | | 100.0 | 100.0 | 50.0 |
| | Reflectance R2 (%) | 81.1 | | 42.0 | 37.1 | 81.1 |
| | Thickness (μm) | 0.05 | 0.05 | 0.05 | 0.05 | 0.05 |
| | Production method | Sputtering | Sputtering | Sputtering | Sputtering | Sputtering |
| Metal supporting layer | Material | Stainless steel[*2] | Stainless steel[*2] | Copper alloy[*1] | Copper alloy[*1] | Copper alloy[*1] |
| | Reflectance R3 (%) | 62.1 | 62.1 | 81.1 | 81.1 | 81.1 |
| Difference between reflectance R1 of wiring layer and reflectance R2 around wiring layer | R1 − R2 (%) | 13.5 | — | 51.3 | 44.0 | −50.8 |
| | R1 − R3 (%) | 32.5 | 32.5 | 12.1 | 0.0 | −50.8 |
| Evaluation | Inspection of wires | Bad | Bad | Good | Good | Good |

[*1]Copper alloy: Copper-titanium alloy
[*2]Stainless steel: SUS304

TABLE 2

| Light with wavelength of 650 nm | | Example 8 | Example 9 | Example 10 | Example 11 | Example 12 |
|---|---|---|---|---|---|---|
| Wiring layer | Material | Copper | Copper | Copper | Copper | Copper |
| | Surface roughness Ra (nm) | 50.0 | 50.0 | 50.0 | 50.0 | 50.0 |
| | Reflectance R1 (%) | 94.6 | 94.6 | 94.6 | 94.6 | 94.6 |
| Different-reflectance layer | Material | Nickel | Titanium | Tungsten | Zinc | Iron |
| | Surface roughness Ra (nm) | 100.0 | 100.0 | 100.0 | 100.0 | 100.0 |
| | Reflectance R2 (%) | 45.0 | 45.3 | 36.6 | 37.1 | 30.3 |
| | Thickness (μm) | 0.05 | 0.05 | 0.05 | 0.05 | 0.05 |
| | Production method | Sputtering | Sputtering | Sputtering | Sputtering | Sputtering |
| Metal supporting layer | Material | Copper alloy*1 | Copper alloy*1 | Copper alloy*1 | Copper alloy*1 | Copper alloy*1 |
| | Reflectance R3 (%) | 81.1 | 81.1 | 81.1 | 81.1 | 81.1 |
| Difference between reflectance R1 of wiring layer and reflectance R2 around wiring layer | R1 − R2 (%) | 49.6 | 49.3 | 58.0 | 57.5 | 64.3 |
| | R1 − R3 (%) | 13.5 | 13.5 | 13.5 | 13.5 | 13.5 |
| Evaluation | Inspection of wires | Good | Good | Good | Good | Good |

*1Copper alloy: Copper- titanium alloy

TABLE 3

| Light with wavelength of 850 nm | | Example 13 | Comp. Ex. 5 | Example 14 | Example 15 |
|---|---|---|---|---|---|
| Wiring layer | Material | Copper | Copper | Gold | Copper alloy*1 |
| | Surface roughness Ra (nm) | 50.0 | 50.0 | 50.0 | 50.0 |
| | Reflectance R1 (%) | 97.7 | 97.7 | 96.4 | 88.1 |
| Different-reflectance layer | Material | Chromium | Copper alloy*1 | Chromium | Zinc |
| | Surface roughness Ra (nm) | 100.0 | 50.0 | 100.0 | 100.0 |
| | Reflectance R2 (%) | 42.0 | 88.1 | 42.0 | 35.5 |
| | Thickness (μm) | 0.05 | 0.05 | 0.05 | 0.05 |
| | Production method | Sputtering | Sputtering | Sputtering | Sputtering |
| Metal supporting layer | Material | Copper alloy*1 | Copper alloy*1 | Copper alloy*1 | Copper alloy*1 |
| | Reflectance R3 (%) | 88.1 | 88.1 | 88.1 | 88.1 |
| Difference between reflectance R1 of wiring layer and reflectance R2 around wiring layer | R1 − R2 (%) | 55.7 | 9.6 | 54.4 | 52.6 |
| | R1 − R3 (%) | 9.6 | 9.6 | 8.3 | 0.0 |
| Evaluation | Inspection of wires | Good | Bad | Good | Good |

*1Copper alloy: Copper- titanium alloy

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The method of the present invention is used for manufacturing a wiring circuit board.

DESCRIPTION OF REFERENCE NUMERALS 1 wiring circuit board
2 metal supporting layer
3 different-reflectance layer
4 insulating base layer
5 wiring layer
11 inspection light
12 reflected light
13 first reflected light
14 second reflected light
R1 reflectance of wiring layer R2 reflectance of different-reflectance layer
R3 reflectance of metal supporting layer

The invention claimed is:

1. A method for manufacturing a wiring circuit board, the method comprising the steps of:
   providing a metal supporting layer, a different-reflectance layer, an insulating layer, and a wiring layer sequentially toward one side in a thickness direction; and
   irradiating the wiring circuit board with inspection light containing one wavelength in light between wavelengths of 650 nm or more and 950 nm or less from one side in the thickness direction of the wiring circuit board to inspect an outer shape of the wiring layer based on reflected light reflected at the wiring circuit board,
   wherein in the irradiating step, the wiring layer is inspected based on a contrast between first reflected light reflected at one surface in the thickness direction of the wiring layer and second reflected light reflected at one surface in the thickness direction of the different-reflectance layer, and
   wherein a difference between a reflectance R1 of the wiring layer with respect to the light with the one wavelength and a reflectance R2 of the different-reflectance layer with respect to the light with the one wavelength is 40% or more.

2. The method according to claim 1, wherein the reflectance R1 of the wiring layer is higher than the reflectance R2 of the different-reflectance layer.

3. The method according to claim 1, wherein a material of the wiring layer is at least one of copper or gold, and a material of the different-reflectance layer is at least one metal selected from the group consisting of chromium, nickel, titanium, tungsten, zinc, and iron.

4. The method according to claim 1, wherein a difference between the reflectance R1 of the wiring layer and a reflectance R3 of the metal supporting layer with respect to the light with the one wavelength is 20% or less.

5. The method according to claim 1, wherein the different-reflectance layer has a thickness of 0.1 μm or less.

6. The method according to claim 1, wherein the providing step includes forming the different-reflectance layer by sputtering.

* * * * *